United States Patent [19]
Sohara

[11] Patent Number: 5,920,126
[45] Date of Patent: Jul. 6, 1999

[54] SEMICONDUCTOR DEVICE INCLUDING A FLIP-CHIP SUBSTRATE

[75] Inventor: Tsuyoshi Sohara, Kawasaki, Japan

[73] Assignee: Fujitsu Limited, Kawasaki, Japan

[21] Appl. No.: 09/162,770

[22] Filed: Sep. 30, 1998

Related U.S. Application Data

[63] Continuation-in-part of application No. 09/034,799, Mar. 4, 1998, abandoned.

[30] Foreign Application Priority Data

Oct. 2, 1997 [JP] Japan ..................................... 9-270174

[51] Int. Cl.⁶ .......................... H01L 23/48; H01L 23/495
[52] U.S. Cl. ........................... 257/778; 287/667; 287/774
[58] Field of Search .................................... 257/778, 667, 257/774

[56] References Cited

U.S. PATENT DOCUMENTS

| | | | |
|---|---|---|---|
| 5,394,490 | 2/1995 | Kato et al. ................................. | 385/14 |
| 5,751,060 | 5/1998 | Laine et al. ............................... | 257/702 |
| 5,786,230 | 7/1998 | Anderson et al. ....................... | 437/209 |
| 5,844,319 | 12/1998 | Gamota et al. .......................... | 257/778 |

FOREIGN PATENT DOCUMENTS 8-181239  7/1996  Japan .

*Primary Examiner*—Teresa M. Arroyo
*Attorney, Agent, or Firm*—Armstrong, Westerman, Hattori, McLelalnd & Naughton

[57] ABSTRACT

A semiconductor device includes a flip-chip substrate carrying thereon a conductor pattern and an insulation film, a cutout formed in the insulation film so as to expose a part of the conductor pattern, a semiconductor chip mounted on the flip-chip substrate and carrying electrodes in electrical contact with the conductor pattern exposed by the cutout, and a resin layer filling a space formed between the semiconductor chip and the flip-chip substrate, wherein the cutout is provided in correspondence to the electrodes and extends continuously to form a closed loop.

6 Claims, 12 Drawing Sheets

5,920,126

SEMICONDUCTOR DEVICE INCLUDING A FLIP-CHIP SUBSTRATE

This application is a Continuation-in-Part (CIP) of prior application Ser. No. 09/034,799 filed Mar. 4, 1998, now abandoned.

BACKGROUND OF THE INVENTION

The present invention generally relates to semiconductor devices and more particularly to a semiconductor device including a semiconductor chip mounted on a flip-chip substrate.

With wide-spreading use of semiconductor devices in various electronic apparatuses, there is an ever increasing demand of improved reliability in the semiconductor devices used in these electronic apparatuses.

Semiconductor devices for use in electronic apparatuses are provided generally in the form of an interconnection substrate carrying thereon one or more semiconductor chips.

With increasing demand for high performance operation of the semiconductor devices, recent semiconductor devices use a so-called flip-chip substrate for the interconnection substrate wherein the flip-chip substrate carries thereon one or more bare semiconductor chips in a face-down state by using a flip-chip mounting process. By using a flip-chip mounting process, the density of mounting the semiconductor chips on the interconnection substrate is increased substantially. Further, the number of interconnections in each of the semiconductor chip is increased without increasing the outer size of the semiconductor chip.

In order to improve the reliability of the semiconductor device having such a flip-chip substrate, it is necessary to improve the reliability of the flip-chip process for mounting the semiconductor chips.

FIGS. 1 and 2 show the construction of a related semiconductor device having a flip-chip substrate 100 on which a semiconductor chip 102 is mounted in a face-down state respectively in an oblique view before the mounting of the semiconductor chip 102 and in a cross-sectional view after the mounting of the semiconductor chip 102.

Referring to FIGS. 1 and 2, the substrate 100 includes a base substrate 106 and a solder resist layer 110, wherein the base substrate 106 is formed of a commonly used printed circuit board and may include a plurality of interconnection layers. As indicated in the cross-sectional view of FIG. 2, the base substrate 106 carries a plurality of solder bumps 114 on a bottom surface thereof for external interconnection. Further, the base substrate 106 carries on a top surface thereof a conductor pattern 108, wherein the conductor pattern 108 is connected to a solder bump 114 by way of an interconnection pattern provided inside the base substrate 106.

The solder resist layer 110, on the other hand, is formed of an insulating resin and is provided on the base substrate 106 for preventing a short-circuit between the mounted semiconductor chip 102 and the conductor pattern 108. As indicated in FIG. 1, the solder resist layer 110 is formed with four mutually isolated elongating slits 112 each exposing a part of the conductor pattern 108, wherein the elongating slits 112 are formed in correspondence to stud bumps 104 that are provided on a bottom surface of the semiconductor chip 102 along a peripheral edge thereof for external connection. It should be noted that the elongating slits 112 are isolated from each other by a corner part 122 of the solder resist layer 110.

In the state of FIG. 2, it can be seen that the stud bumps 104 protruding from the semiconductor chip 102 are soldered upon the corresponding conductor pattern 108 by a solder alloy 116. Further, the space between the semiconductor chip 102 and the flip-chip substrate 100 is filled by an under-fill resin layer 118. By providing the under-fill resin layer 118 as such, the stress induced in the part where the stud bump 104 is soldered to the conductor pattern 108 as a result of the difference in the thermal expansion coefficient between the semiconductor chip 102 and the base substrate 106, is successfully relaxed and the interconnection between the stud bump 104 and the conductor pattern 108 is protected from a mechanical as well as electrical failure.

It should be noted that the under-fill resin 118 is introduced into the foregoing space between the semiconductor chip 102 and the flip-chip substrate 100 after the semiconductor chip 102 is soldered upon the conductor pattern 108 on the base substrate 106 by the solder alloy 116 as indicated in FIG. 3, wherein it can be seen that the under-fill resin 118 is caused to flow over the surface of the flip-chip substrate 100 in a molten state. The under-fill resin 118 thus introduced is cured subsequently by applying a heat treatment process.

In order to achieve a reliable isolation of the individual stud bumps 104, it is desirable that the opening corresponding to the slit 112 is formed for each of the stud bumps 104. However, the formation of such minute openings in the solder resist layer 122 is difficult in view of the reduced pitch of 85–100 μm for the stud bumps 104.

Meanwhile, the inventor of the present invention has discovered, while practicing the process of FIG. 3, that a void 120 is tend to be formed in the under-fill resin layer 118 generally at the end part of the elongating slit 112 as indicated in FIG. 4. When such a void 120 is formed, the void may be filled by the molten solder alloy 116 as a reflowing process of the solder alloy is conducted, while the solder alloy thus filling the void 120 may cause an unwanted short-circuit in the stud bump 104. When the void 120 remains vacant, on the other hand, the heating process applied for curing the under-fill resin layer 118 may induce an expansion of the air filling the void 120. Thereby, there is a substantial risk that the under-fill resin layer 118 is cracked in the vicinity of the void 120. Alternatively, the stud bump 104 and the conductor pattern 108 may be disconnected due to the mechanical deformation associated with the expansion of the void 120.

According to the investigation conducted by the inventor with regard to this phenomenon, it was discovered that the formation of the void 120 occurs primarily due to the difference in the flowing speed of the molten resin 118 over the solder resist layer 110 and over the base substrate 106 exposed by the elongating slit 112 including the conductor pattern 108. As indicated in FIG. 3 by an arrow $V_1$, the flowing speed of the molten resin 118 over the solder resist layer 110 is substantially larger than the flowing speed of the molten resin over the exposed surface of the slit 112 indicated in FIG. 3 by an arrow $V_2$.

FIG. 4 shows the mechanism of formation of the void 120.

Referring to FIG. 4, the molten under-fill resin 118 is supplied from the upper part in the plan view of FIG. 4 wherein the molten resin 118 thus introduced is caused to flow in the downward direction of the drawing. Thereby, the molten resin 118 flows over the flat solder resist layer 110 covering the surface of the base substrate 106 at the speed $V_1$ larger than the speed $V_2$ for the case the same molten resin flows over the exposed surface of the elongating slit 112. As a result of the foregoing difference in the flowing speed, the direction of flow of the molten resin 118 is bent at the edge part or end part of the slit 112 as indicated by arrows A in FIG. 4, and the molten resin 118 goes around the edge part of the elongating slit 112. With further supplying of the molten under-fill resin 118, the isolated voids 120 are formed at the edge part of the slits 112 as indicated in FIG. 5.

The reason that the foregoing difference in the flowing speed arises is considered as follows. When the molten resin forming the under-fill resin layer 118 flows over the solder resist layer 110, which is also formed of a resin, an excellent wetting is guaranteed due to the affinity of the materials forming the molten under-fill resin layer 118 and the solder resist layer 110. Further, the solder resist layer 110 has a flat smooth surface that facilitates the smooth flow of the molten resin layer 118 over the solder resist layer 110.

When the molten under-fill resin layer 118 flows over the exposed surface of the elongating slit 112, on the other hand, the molten resin 118 encounters irregular projections formed by the conductor patterns 108, wherein the irregular projections act as an obstacle to the flow of the molten resin 108. Further, the elongating slit 112 defines a groove characterized by a stepped edge, while the existence of such a stepped edge increases the surface area and hence the friction against the flow of molten under-fill resin layer 118.

It has further been discovered that the problem of the formation of void 120 becomes conspicuous when the semiconductor chip 102 used in the semiconductor device has a size of 10 mm or more fore each edge.

SUMMARY OF THE INVENTION

Accordingly, it is a general object of the present invention to provide a novel and useful semiconductor device including a flip-chip substrate wherein the foregoing problems are eliminated.

Another and more specific object of the present invention is to provide a semiconductor device including a flip-chip substrate carrying thereon a semiconductor chip, wherein a resin layer fills a space between said flip-chip substrate and said semiconductor chip without forming a void.

Another object of the present invention is to provide a semiconductor device, comprising:

a flip-chip substrate, said flip-chip substrate including a conductor pattern and an insulation film, such that said insulation film covers said conductor pattern;

a cutout formed in said insulation film so as to expose a part of said conductor pattern;

a semiconductor chip mounted on said flip-chip substrate, said semiconductor chip carrying electrodes in electrical contact with said conductor pattern exposed by said cutout; and a resin layer filling a space formed between said semiconductor chip and said flip-chip substrate;

wherein said cutout is provided in correspondence to said electrodes and extends continuously to form a closed loop.

According to the present invention, the resin layer filing the foregoing space between the semiconductor chip and the flip-chip substrate is formed without a substantial void by merely causing a molten resin from one side of the space to the opposite side. As the cutout is now formed in the continuous form without interruption, the flow of the molten resin going around the edge part of the cutout as explained with reference to FIG. 4 does not occur anymore, and the problem of the void remaining in the cured resist layer is successfully eliminated.

Other objects and further features of the present invention will become apparent from the following detailed description when read in conjunction with the attached drawings.

DETAILED DESCRIPTION OF THE PREFERRED EMBODIMENT

FIRST EMBODIMENT

Figure 6:
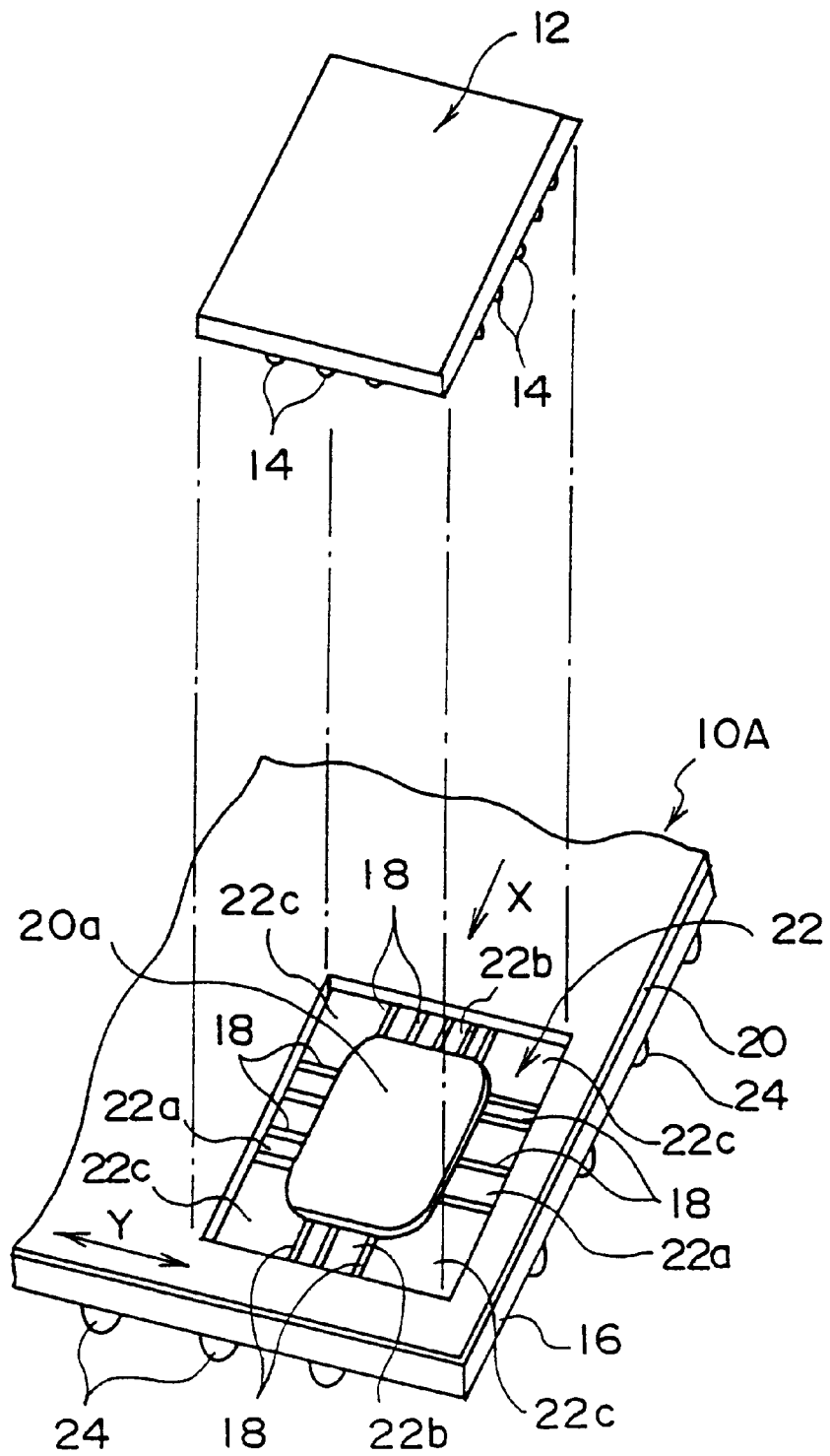
FIG. 6 is a diagram showing the construction of a semiconductor device using a flip-chip substrate according to a first embodiment of the present invention.
Figure 7:
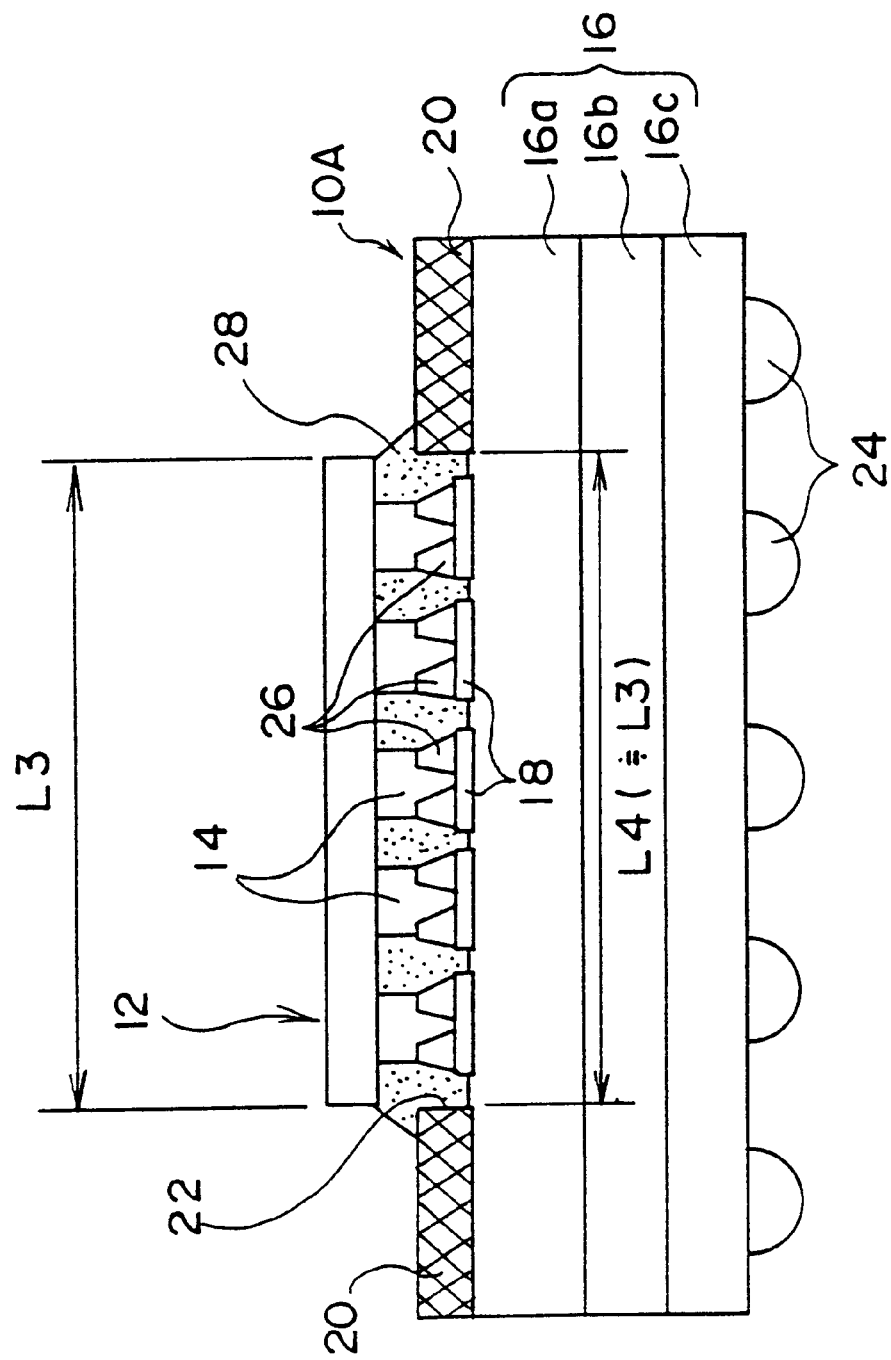
FIG. 7 is a diagram showing the semiconductor device of FIG. 6 in a cross-sectional view.

FIG. 6 shows the construction of the semiconductor device according to a first embodiment of the present invention in an exploded state while FIG. 7 shows the same semiconductor device in a cross-sectional view.

Referring to FIG. 6, the semiconductor device includes a flip-chip substrate 10A and a semiconductor chip 12, wherein the flip-chip substrate 10A includes a base substrate 16 of a glass-epoxy or polycarbonate and a solder resist layer 20 is provided on the base substrate 16. It should be noted that the base substrate 16 may have a multilayer structure including a plurality of layers 16a–16c each carrying a corresponding conductor pattern. On the top surface of the base substrate 16, a conductor pattern 18 is formed. Further, bump electrodes 24 are formed on a bottom surface of the base substrate 16 for external interconnection. The conductor pattern 18 is connected to the solder bumps 24 by the conductor patterns formed inside the base layer 16. The conductor pattern 18 as well as the conductor patterns inside the base layer 16 including the layers 16a–16c may be formed by a screen printing of a Cu pattern.

The solder resist layer 20 is typically formed of an insulation film of an epoxy resin and covers the top surface of the base substrate 16 with a generally uniform thickness, wherein the solder resist layer 20 is provided for avoiding a short-circuit between the semiconductor chip 12 and the conductor pattern 18.

In order to achieve an electrical interconnection between the semiconductor chip 12 and the conductor pattern 18 on the base substrate 16, the solder resist layer 20 is formed with a continuous cutout 22 extending along a periphery of the semiconductor chip 12 to be mounted on the base substrate 16. It should be noted that the semiconductor chip 12 carries stud bumps 14 on a bottom surface thereof for electrical interconnection along the periphery thereof. Thereby, the stud bumps 14 achieve an electrical contact with corresponding parts of the conductor pattern 18. As a result of the formation of the continuous cutout 22 in the solder resist layer 20, there is formed a central island 20a of the material identical in composition and thickness to the solder resist layer 20. The details and functions of the continuous cutout 22 will be described later in more detail.

It should be noted that the stud bumps 14 are formed of Au and provided conveniently by using the art of wire bonding process. By soldering the stud bumps 14 to the corresponding conductor patterns 18 by a solder alloy 26 as indicated in the cross-sectional view of FIG. 7, the semiconductor chip 12 is mounted on the flip-chip substrate 10A electrically as well as mechanically in a face-down state. A solder alloy of the Sn—Ag system typically having a composition of Sn 96.5 wt % and Ag 3.5 wt % may be used for the solder alloy 26. The solder alloy 26 may be precoated on the conductor pattern 18.

It should be noted that FIG. 7 shows an under-fill resin layer 28 provided between the semiconductor chip 12 and the flip-chip substrate 10A. In the particular cross-sectional view of FIG. 7, the under-fill resin layer 28 fills a space formed between the bottom surface of the chip 12 and the exposed top surface of the base substrate 16. As will be explained later in detail, the under-fill resin layer 28 is applied in the low-viscosity molten state. For this purpose, a low viscosity epoxy resin is selected for the under-fill resin layer 28. By providing the under-fill resin layer 28, the stress, which is induced in the stud bumps 14 as a result of the difference in the thermal expansion between the semiconductor chip 12 and the flip-chip substrate 10A, is successfully relaxed and the part where the stud bumps 14 are soldered upon the conductor pattern 18 is protected from damages. Thereby, the semiconductor device shows an improved reliability.

After the molten under-fill resin layer 28 is applied, the same is cured by applying a heat treatment process.

Hereinafter, the continuous cutout 22 will be described.

Figure 1:
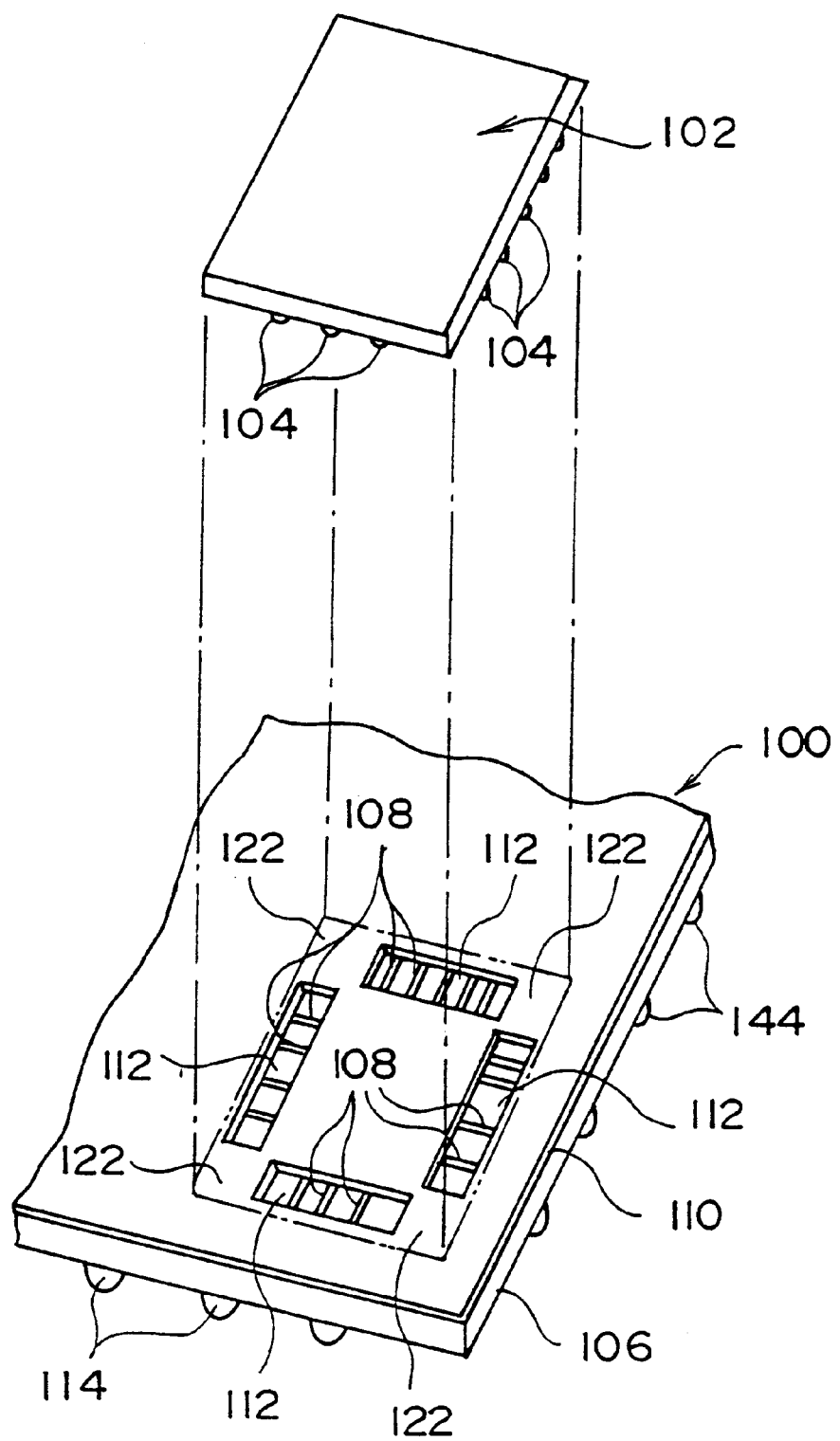
FIG. 1 is a diagram showing the construction of a conventional semiconductor device using a flip-chip substrate.
Figure 2:
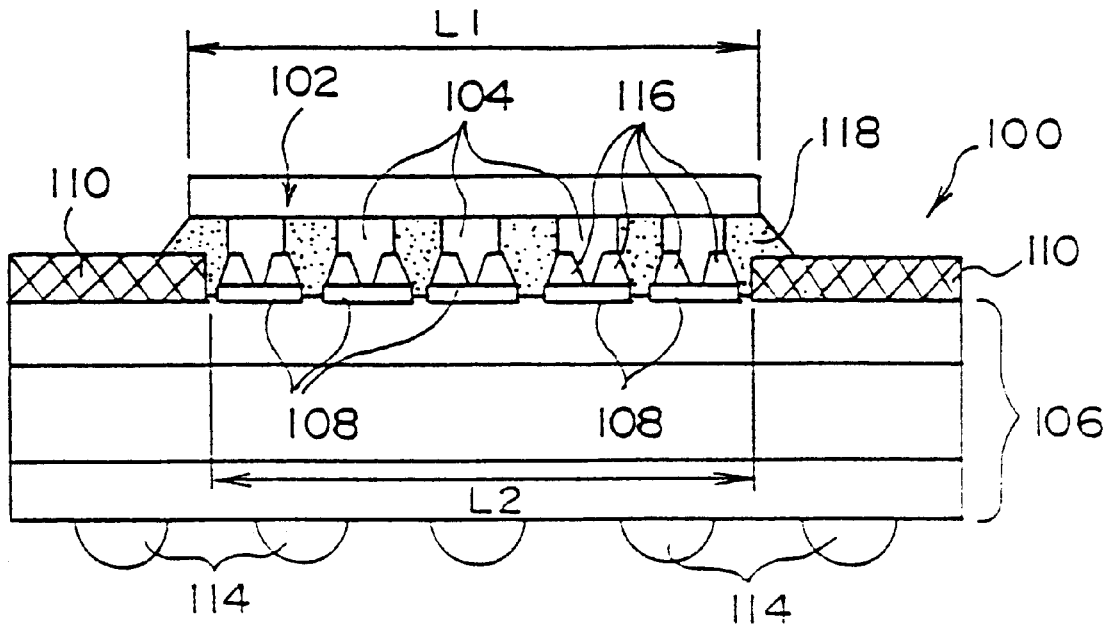
FIG. 2 is a diagram showing the semiconductor device of FIG. 1 in a cross-sectional view.

Referring to FIG. 6, the continuous cutout 22 is a region in which the solder resist layer 20 is selectively removed generally in a rectangular form along the peripheral edge of the semiconductor chip 12. Thereby, the surface of the base substrate 16 and the conductor pattern 18 are exposed at the bottom of the cutout 22. In comparison with the conventional cutout 112 shown in FIG. 1, it should be noted that the four cutouts 112 of FIG. 1 are interconnected with each other by removing the solder resist layer 20 at the four corners.

In the description hereinafter, the part of the cutout 22 extending in an X-direction, in which direction the molten resin forming the under-fill resin layer 28 is caused to flow, is designated as a longitudinal part 22a, while the part extending in a Y-direction perpendicularly to the X-direction is designated as a lateral part 22b. Further, the part where a longitudinal part 22a continues to a lateral part 22b is designated as a corner part 22c. See FIG. 6.

As already noted, the rectangular cutout 22 defines a rectangular central island 20a of the same material as the solder resist layer 20, wherein it should be noted that the central island 20a covers the conductor pattern 18 underneath, and the problem of the conductor pattern 18 contacting the bottom surface of the semiconductor chip 12, on which the semiconductor device patterns are formed, is successfully avoided. When the central island 20a is not to be formed, it is therefore necessary to design the conductor pattern 18 so as to avoid the foregoing central part of the cutout 22. By providing the central island 20a, the degree of freedom of designing the conductor pattern 18 is increased substantially.

Next, the filling of the molten resin to form the under-fill resin layer 28 will be described with reference to FIGS. 8–11 that show the result of the experiments conducted by the inventor, wherein those parts corresponding to the parts described heretofore are designated by the same reference numerals and the description thereof will be omitted.

Figure 8:
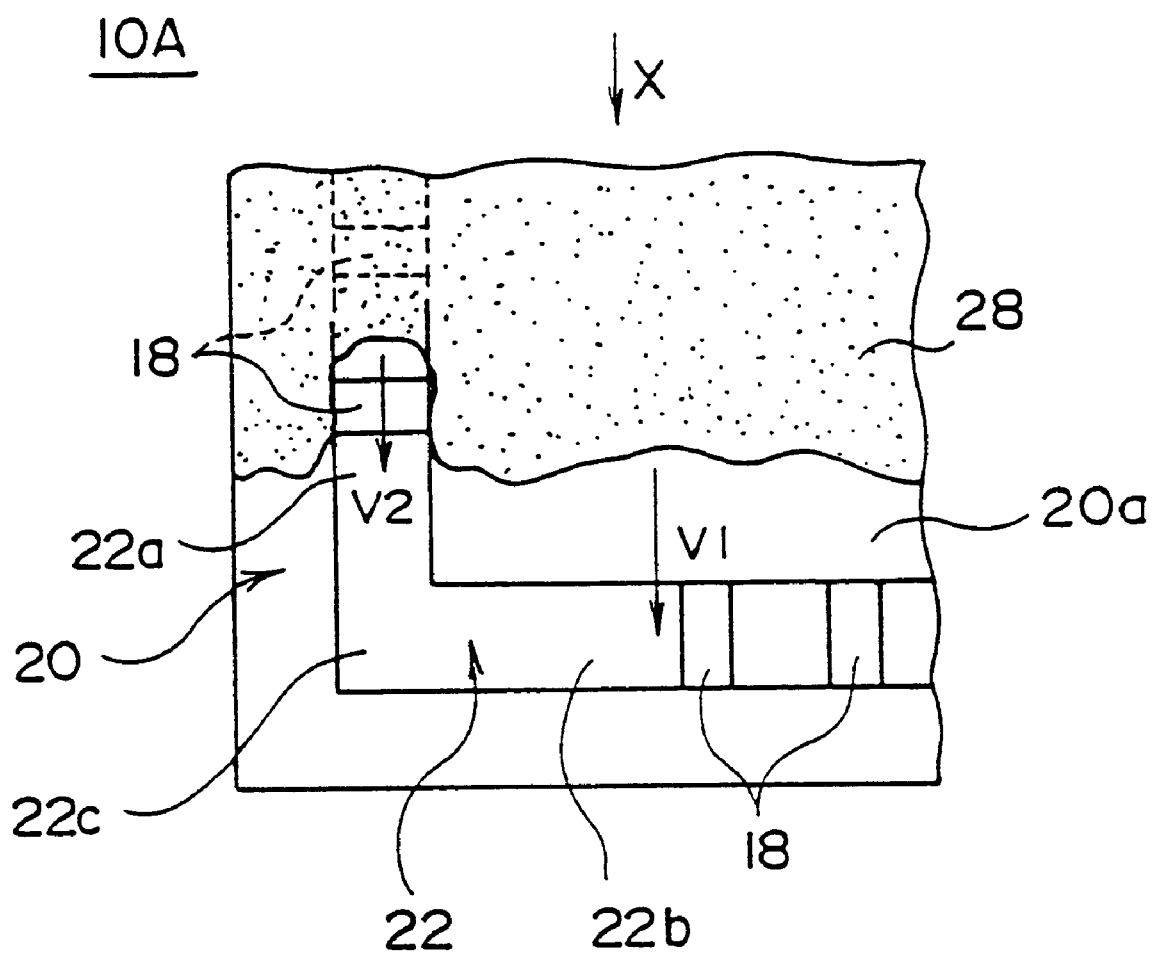
FIGS. 8–11 are diagrams showing a flow of a molten resin when forming the semiconductor device of FIG. 6.

Referring to FIG. 8, a molten resin is supplied to the space formed between the semiconductor chip 12 and the flip-chip substrate 10A and is caused to flow in the X-direction.

Figure 3:
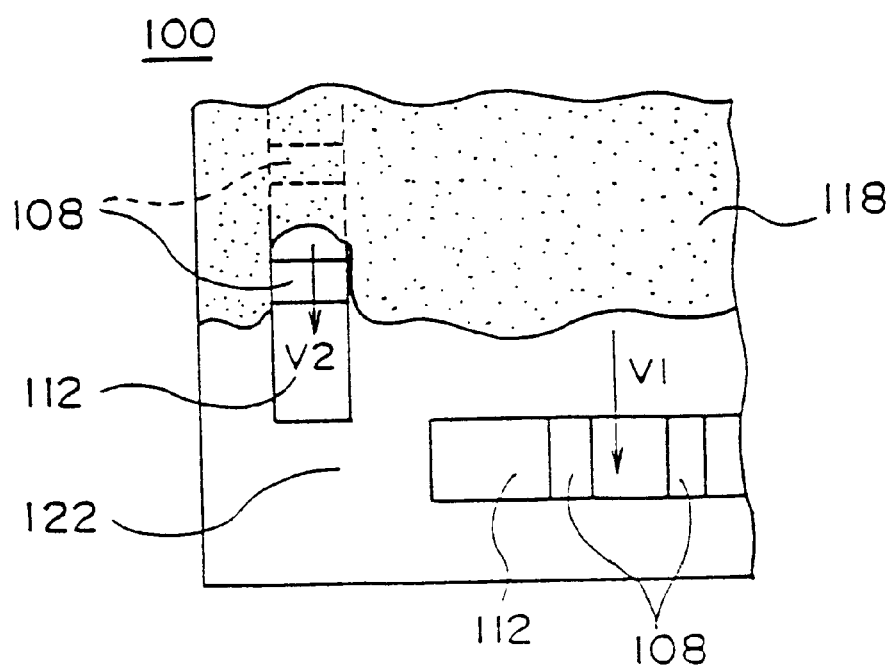
FIGS. 3–5 are diagrams showing a flow of a molten resin when forming the semiconductor device of FIG. 1.

Referring to FIG. 8, it was discovered that the molten resin flowing in the X-direction over the solder resin layer 20 including the island 20a flows with a larger speed $V_1$ in the X-direction, while the molten resin flowing on the exposed surface of the cutout 22 flows in the X-direction with a slower speed $V_2$ ($V_1 > _2$) This phenomenon and the interpretation thereof are explained already with reference to FIG. 3.

Figure 4:
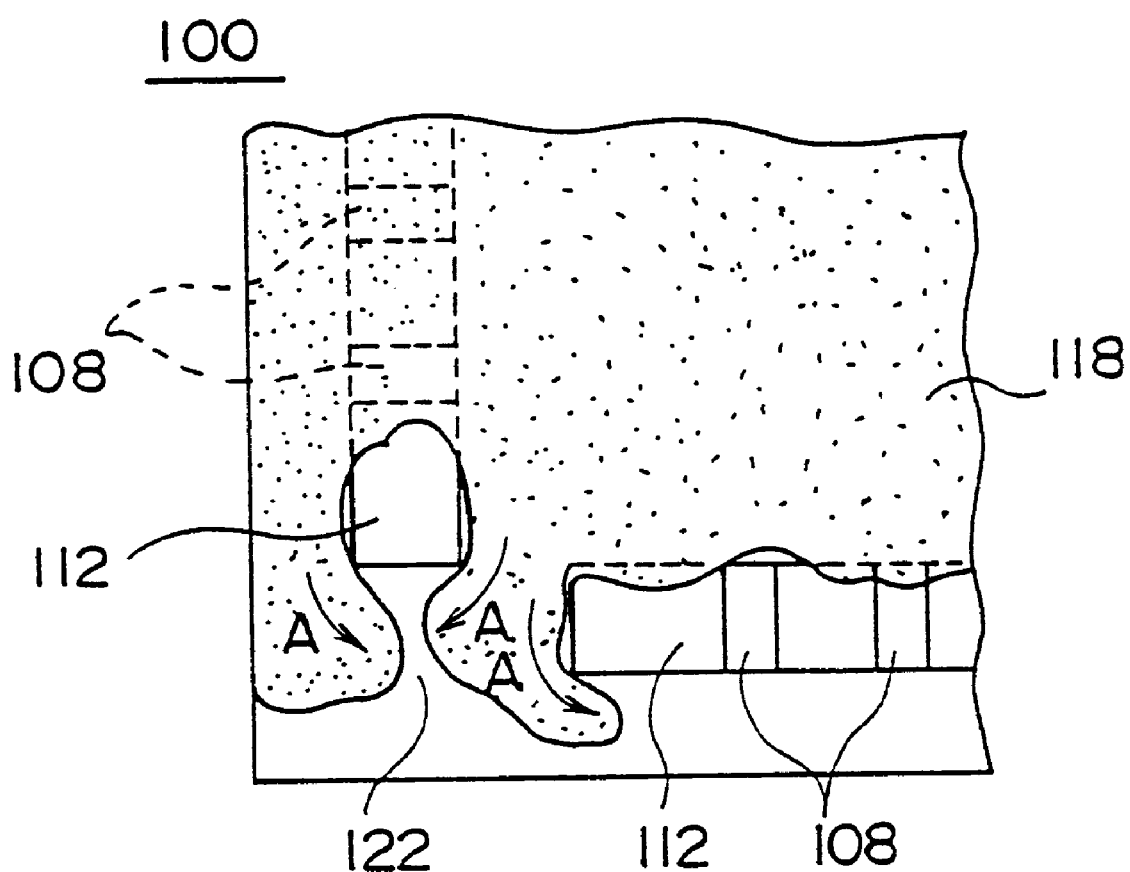
Figure 5:
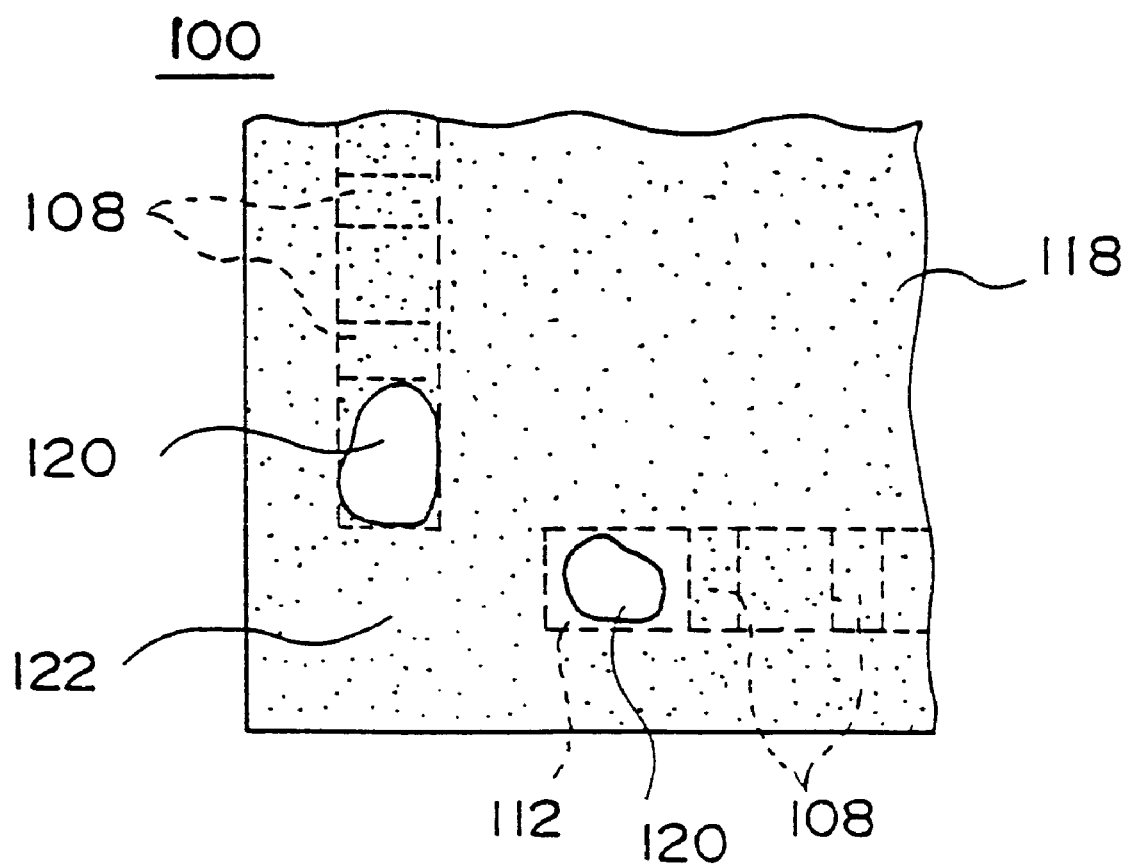
Figure 9:
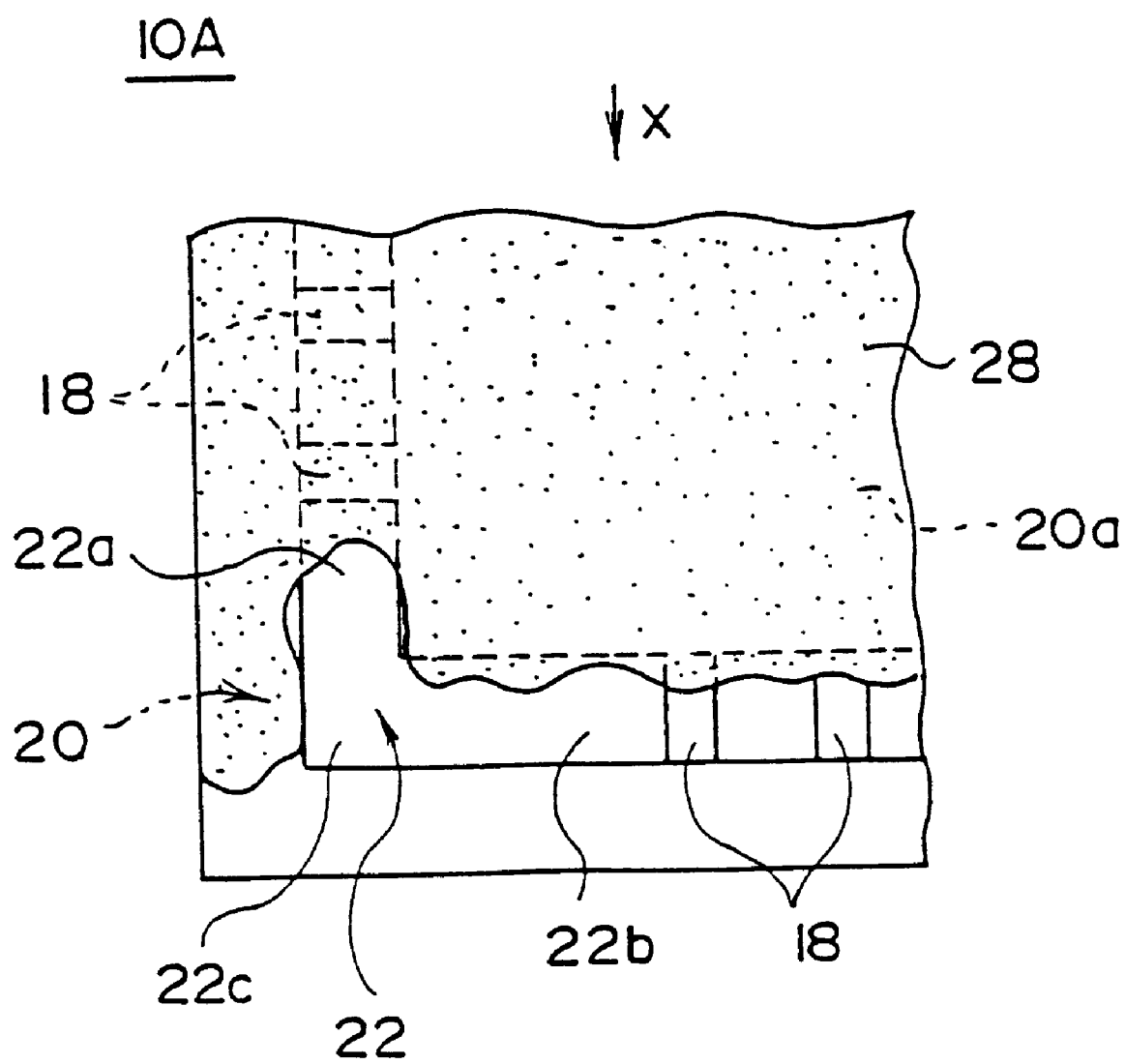
Figure 10:
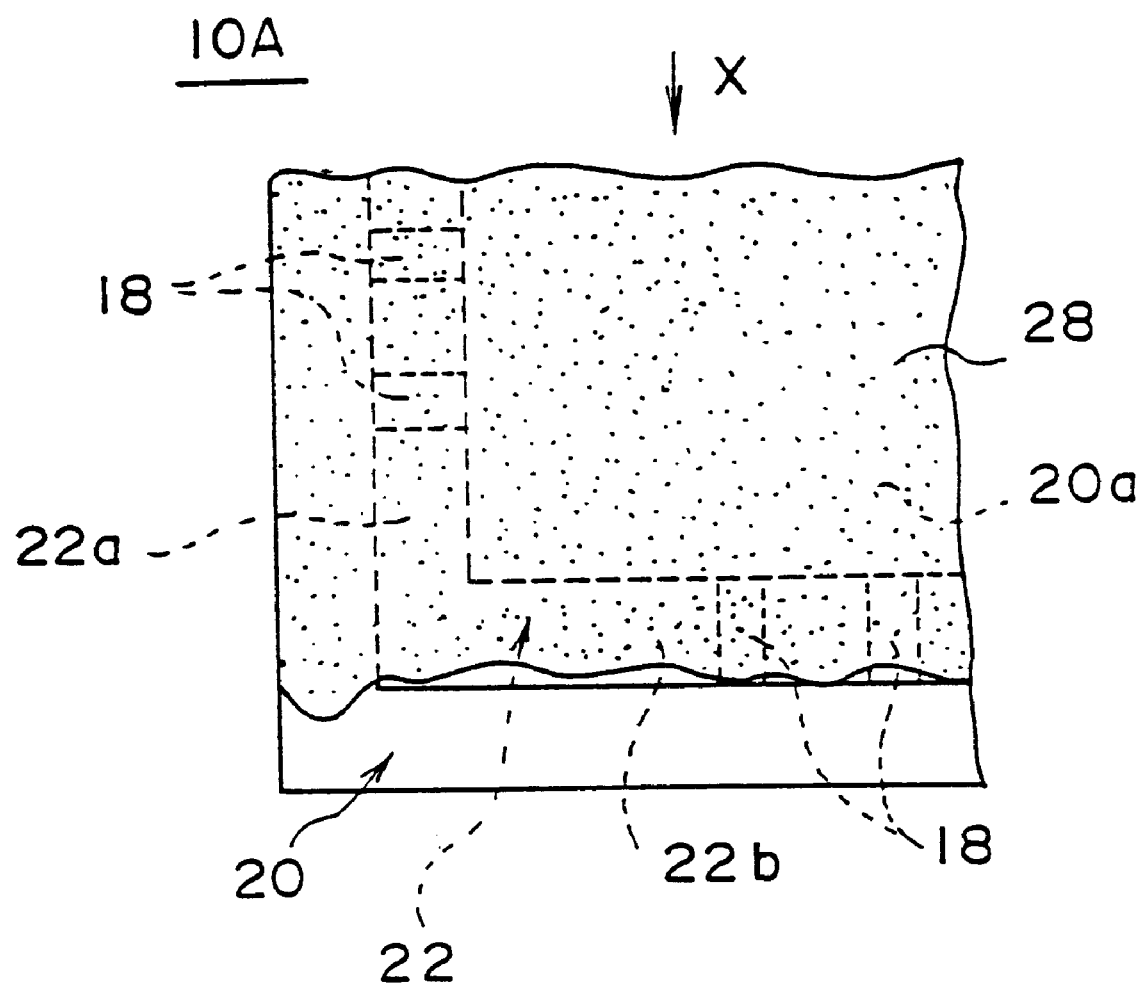

When the molten resin 28 flows further in the direction as indicated in FIG. 9 and reach the horizontal part 22b of the cutout 22, on the other hand, the molten resin is prevented from continuously going further at the same speed $V_1$ as in the conventional case of FIG. 4, due to the existence of the corner part 22c in the cutout 22. Thereby, the molten resin that has reached the horizontal part 22b of the cutout 22 reduces the speed thereof in the X-direction, and the molten resin 28 flowing along the longitudinal part 22a of the cutout 22 with the speed $V_2$ catches up the molten resin 28 that has flowed over the island 20a as the molten resin fills the horizontal part 22b of the cutout 22. See FIG. 10. In the state of FIG. 10, it can be seen that the molten resin 28 flowing in the X-direction has a generally linear front edge extending perpendicularly to the X-direction.

Figure 11:
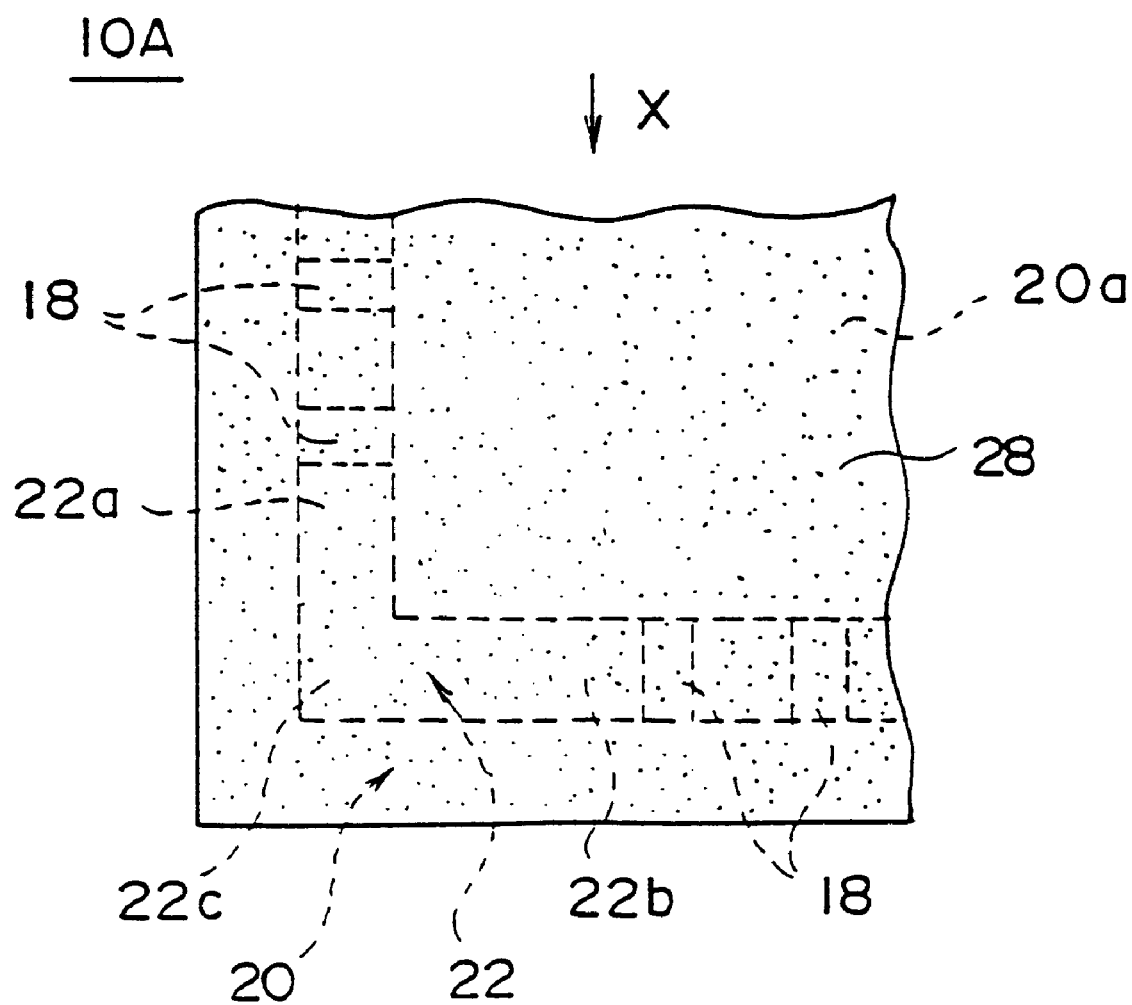

By continuously causing the molten resin 28 to flow in the X-direction further, the molten resin 28 covers the surface of the flip-chip substrate 10A as indicated in FIG. 11, without forming a void. Thus, the forgoing corner part 22c of the cutout 22 functions to reduce the speed of the molten resin flowing over the island region 20a of the solder resin 20.

SECOND EMBODIMENT

Figure 12:
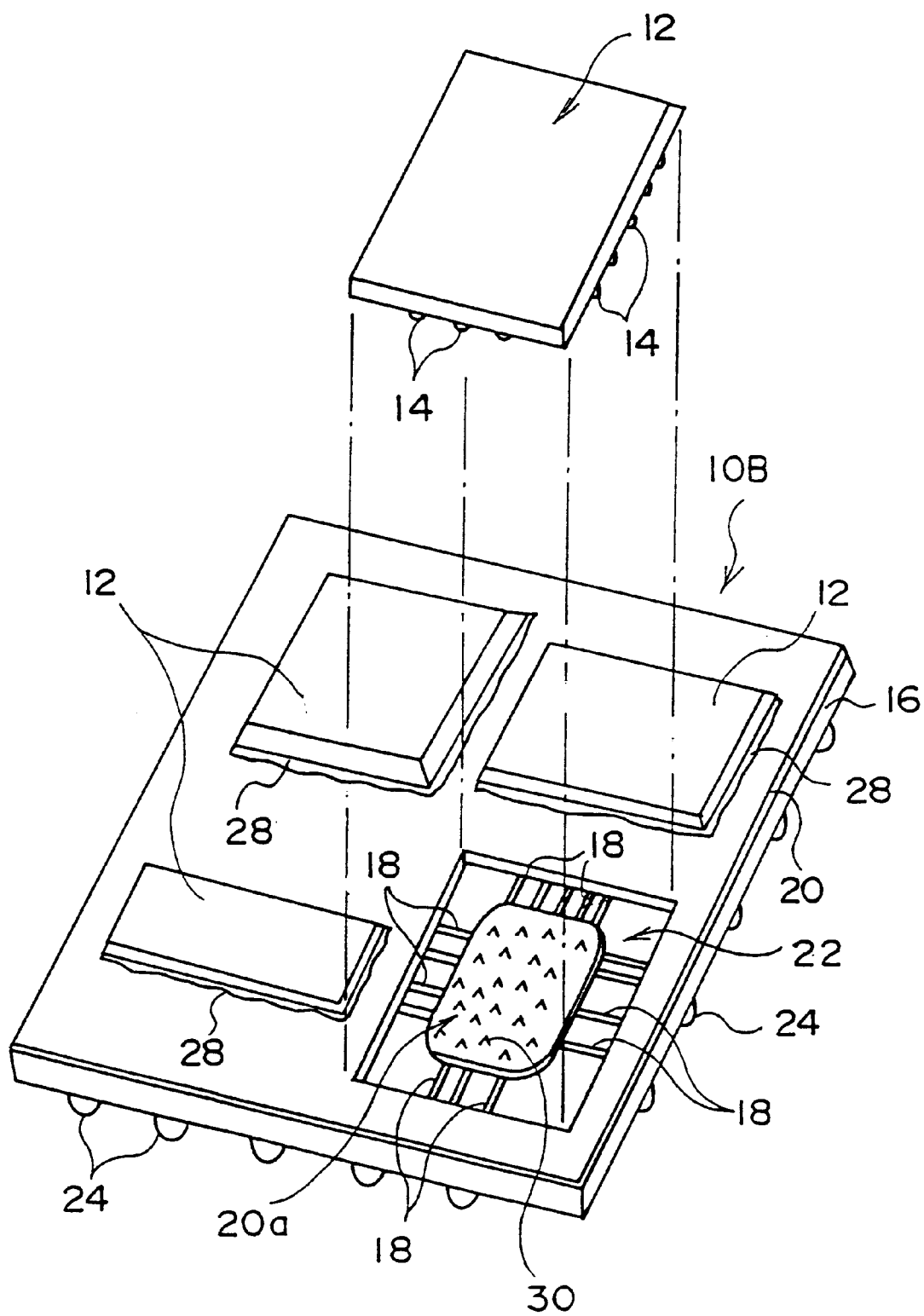
FIG. 12 is a diagram showing the construction of a semiconductor device using a flip-chip substrate according to a second embodiment of the present invention.

FIG. 12 shows the construction of a flip-chip substrate 10B according to a second embodiment of the present invention in an oblique view, wherein those parts corresponding to the parts described previously are designated by the same reference numerals and the description thereof will be omitted.

Referring to FIG. 12, the flip-chip substrate 10B is used as a mother board of a multiple-chip module (MCM), wherein it should be noted that the flip-chip substrate 10B carries thereon a plurality of semiconductor chips 12. Thereby, the part of the solder resist layer 20 on which the semiconductor chip 12 is to be mounted is formed with the continuous cutout 22 that is formed along the periphery of the semiconductor chip 12.

Similarly as before, the cutout 22 defines the central island 20a, wherein the central island 20a of the present embodiment has a rough surface 30, which may typically be formed by a sand-blasting or an etching process.

By forming the rough surface 30 on the central island 20a, the molten resin flowing over the central island 20a experiences an increased friction and the speed $V_1$ of the molten resist over the rough surface 30 is reduced. The rough surface 30 thereby functions as a mechanism for matching the flow speed $V_1$ of the molten resin over the central island 20a and the flow speed $V_2$ of the molten resin over the longitudinal part 22a of the cutout 22.

Thus, the present embodiment is also effective in avoiding the going-around of the molten resin when forming the under-fill resin layer 28, and the formation of the void or cavity therein is effectively avoided. It should be noted that the roughness of the foregoing surface 30 is controlled as desired by controlling the duration of the sandblasting process or an etching process.

THIRD EMBODIMENT

Figure 13:
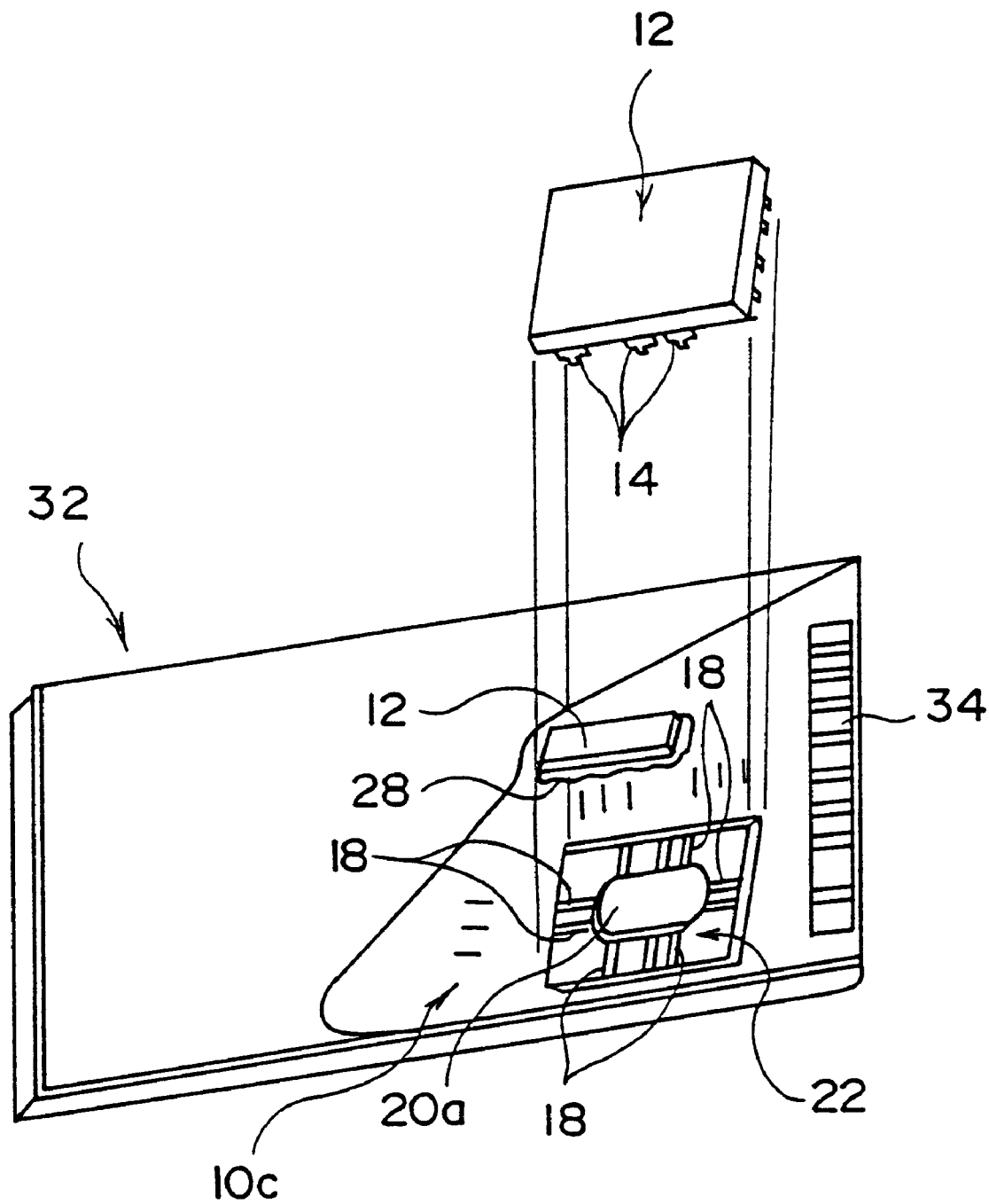
FIG. 13 is a diagram showing the construction of a semiconductor device using a flip-chip substrate according to a third embodiment of the present invention.

FIG. 13 shows the construction of a flip-chip substrate 10C according to a third embodiment of the present invention, wherein those parts corresponding to the parts described previously are designated by the same reference numerals and the description thereof will be omitted.

Referring to FIG. 13, the flip-chip substrate 10C forms an IC card 32 and carries a card-edge connector 34 on an edge part thereof. The semiconductor chip 12 mounted on the flip-chip substrate 10C is fitted into the continuous cutout 22 formed in the solder resist layer 20 covering the base substrate 16. The gap formed between the semiconductor chip 12 and the flip-chip substrate 10C is filled by the under-fill resin 28.

In the construction of the present embodiment, the semiconductor chips 12 are more or less buried in the solder resist layer 20, and the thickness of the IC card 32 is reduced successfully, without increasing the risk of short-circuit between the semiconductor chip 12 and the conductor pattern 18 formed on the base substrate 16 of the flip-chip substrate 10C.

Further, the present invention is not limited to the embodiments described heretofore, but various variations and modifications may be made without departing from the scope of the invention.

What is claimed is:

1. A semiconductor device, comprising:
   a flip-chip substrate, said flip-chip substrate including a conductor pattern and an insulation film, such that said insulation film covers said conductor pattern;
   a cutout formed in said insulation film so as to expose a part of said conductor pattern;
   a semiconductor chip mounted on said flip-chip substrate, said semiconductor chip carrying electrodes in electrical contact with said conductor pattern exposed by said cutout; and
   a resin layer filling a space formed between said semiconductor chip and said flip-chip substrate;
   wherein said cutout is provided in correspondence to said electrodes and extends continuously to form a closed loop.

2. A semiconductor device as claimed in claim 1, wherein said cutout surrounds an island of said insulation film, and wherein said island covers a part of said conductor pattern.

3. A semiconductor device as claimed in claim 1, wherein said cutout extends continuously to form a rectangular shape defined by four corners.

4. A semiconductor device as claimed in claim 1, wherein said cutout extends generally along an outer periphery of said semiconductor chip.

5. A semiconductor device as claimed in claim 2, wherein said island has a rough surface.

6. A semiconductor device, comprising:
   a flip-chip substrate, said flip-chip substrate including a conductor pattern and an insulation film, such that said insulation film covers said conductor pattern;
   a cutout formed in said insulation film so as to expose a part of said conductor pattern;
   a semiconductor chip mounted on said flip-chip substrate, said semiconductor chip carrying electrodes in electrical contact with said conductor pattern exposed by said cutout; and
   a resin layer filling a space formed between said semiconductor chip and said flip-chip substrate;
   wherein said cutout includes means for adjusting a first flow speed of a molten resin flowing over said insulation film and a second flow speed of said molten resin flowing through said cutout such that said first flow speed is substantially identical to said second flow speed.

* * * * *